(12) United States Patent
Takinomi et al.

(10) Patent No.: US 6,509,628 B2
(45) Date of Patent: Jan. 21, 2003

(54) IC CHIP

(75) Inventors: Yutaka Takinomi, Kawasaki (JP); Kazushi Sawai, Kawasaki (JP); Shinichi Watanabe, Aizuwakamatsu (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/014,408

(22) Filed: Dec. 14, 2001

(65) Prior Publication Data

US 2002/0140058 A1 Oct. 3, 2002

(30) Foreign Application Priority Data

Apr. 2, 2001 (JP) ......................................... 2001-103537

(51) Int. Cl.[7] .......................... H01L 23/52; H01L 23/48; H01L 23/04
(52) U.S. Cl. .......................... 257/650; 257/690; 257/698
(58) Field of Search ............................... 257/678, 690, 257/691, 692, 698

(56) References Cited

U.S. PATENT DOCUMENTS 5,982,043 A * 11/1999 Iwata .......................... 257/786
6,201,308 B1 * 3/2001 Ikegami et al. ............. 257/786

FOREIGN PATENT DOCUMENTS

JP 62-5649 1/1987
JP 62-90956 4/1987

* cited by examiner

Primary Examiner—Ngân V. Ngô
(74) Attorney, Agent, or Firm—Armstrong, Westerman & Hattori, LLP

(57) ABSTRACT

In a semiconductor chip, a second power source pad, to which a ground potential is applied, is arranged adjacent to a first power source pad, to which a power source potential is applied, signal pads are arranged adjacent to the second power source pad by the number corresponding to a size of an external part such as a bypass capacitor inserted between power source terminals in an IC chip, and further, a third power source pad, to which the ground potential is applied, is arranged adjacent to the signal pad. The second power source pad or the third power source pad is selected according to the size of the external part, and then, is connected to a lead terminal, to which the ground potential is applied, in an IC chip, thereby providing a power source terminal, to which the ground potential is applied.

6 Claims, 11 Drawing Sheets

IC CHIP

FIELD OF THE INVENTION

The present invention relates to an IC chip in which the position of a power source terminal can be changed.

BACKGROUND OF THE INVENTION

One of the measures against a common mode noise on an application substrate is to insert a bypass capacitor between power source terminals in an IC chip. Insertion of a bypass capacitor can reduce an unnecessary radiation noise adversely affecting an FM radio bandwidth, on which importance is placed from the viewpoint of an application. However, a stray inductance component caused by pattern wiring on a printed circuit board is actually inserted in series in the bypass capacitor, thereby canceling a noise reducing effect of the bypass capacitor. Therefore, it is necessary to dispose the bypass capacitor immediately near an IC chip as possible so as to reduce the inductance component for the purpose of achievement of a sufficient noise reducing effect.

Normally, a terminal of a power source potential VDD and a terminal of a ground potential GND in an IC chip are arranged adjacent to each other. A distance between the adjacent terminals is, for example, about 0.5 mm. In contrast, the size of a bypass capacitor is generally 0.5 mm or greater. Consequently, as shown in FIG. 1, part of each of power source wirings 11 and 12 on a printed circuit board 1 has been conventionally bent such that an interval between the power source wiring 11, to which the power source potential VDD is applied, and the power source wiring 12, to which the ground potential GND is applied, is made to be equal to the size of a bypass capacitor 2, and thus, the bypass capacitor 2 is disposed astride the power source wirings 11 and 12. In FIG. 1, reference numeral 13 designates a signal wiring; reference numeral 3 designates an IC chip; reference numeral 31 designates a power source terminal, to which the power source potential VDD is applied; reference numeral 32 designates a power source terminal, to which the ground potential GND is applied; and reference numeral 33 designates a signal terminal.

In this case, the bypass capacitor 2 is disposed at a position apart from the IC chip 3 by the amount of bending of part of each of the power source wirings 11 and 12, and therefore, the wiring length from the IC chip 3 to the bypass capacitor 2 cannot become shortest. Consequently, since a stray inductance component inserted in series in the bypass capacitor 2 cannot be sufficiently reduced, a noise reducing effect owing to the insertion of the bypass capacitor 2 is cancelled.

In view of this, it is desirable to dispose the bypass capacitor 2 immediately near the IC chip 3 as possible without bending part of each of the power source wirings 11 and 12 on the printed circuit board 1. It may be considered to use a bypass capacitor 2 having a size corresponding to the interval between the power source wirings 11 and 12. However, in this case, the size of the bypass capacitor 2 must be as small as about 0.5 mm. It is difficult to mount the bypass capacitor having such a size on the printed circuit board 1 within current parts mounting capability.

Thus, as shown in FIG. 2, in order to mount a bypass capacitor 2 having a size mountable on a printed circuit board 1 without bending part of each of power source wirings 11 and 12 on the printed circuit board 1, the disposing position of a lead terminal in an IC chip 3 is varied in such a manner that an interval between power source terminals 31 and 32 in the IC chip 3 becomes equal to the size of the bypass capacitor 2. In an example shown in FIG. 2, one signal terminal 33 is interposed between the power source terminals 31 and 32, thereby widening the interval between the power source wirings 11 and 12 in such a manner as to become equal to the size of the bypass capacitor 2.

In order to vary the disposing position of the power source terminal in the IC chip, as described above, a design need be changed such that the arrangement of a power source pad, to which a power source potential VDD is applied, and another power source pad, to which a ground potential GND is applied, on a semiconductor chip corresponds to the disposing position of the power source terminal in the IC chip.

However, the bypass capacitor is formed into a plurality of sizes, and therefore, it is necessary to prepare a plurality of kinds of IC chips on which the power source terminals are arranged in different manners, and further, a plurality of different patterns must be designed, thereby posing a problem that a development period of the IC chip becomes longer or a development cost becomes higher. In the present specification, the semiconductor chip signifies a chip cut off from a wafer, and the IC chip signifies the semiconductor chip enveloped in a package.

SUMMARY OF THE INVENTION

It is an object of the present invention to provide an IC chip in which power source terminals can be arranged in different manners with semiconductor chips fabricated based on one and the same design.

According to one aspect of the present invention, in a semiconductor chip, a second power source pad, to which a second power source potential is applied, is arranged adjacent to a first power source pad, to which a first power source potential is applied, and further, there is provided a third power source pad, to which the second power source potential is applied. Moreover, between the second power source pad and the third power source pad are interposed signal pads by the number corresponding to a size of an external part such as a bypass capacitor inserted between a power source terminal, to which the first power source potential is applied, and a power source terminal, to which the second power source potential is applied. Thereafter, the second power source pad or the third power source pad is selected according to the size of the external part, and then, is connected to the power source terminal, to which the second power source potential is applied, in an IC chip.

According to the above-mentioned aspect of present invention, the second power source pad or the third power source pad is selected as a power source pad, to which the second power source potential is applied, in the semiconductor chip, and then, the selected power source pad is electrically connected to the power source terminal, to which the second power source potential is applied, in the IC chip via a bonding wire. Consequently, the interval between the power source terminal, to which the first power source potential is applied, and the power source terminal, to which the second power source potential is applied, can be varied by an integral multiple of an interval between lead terminals in the IC chip according to the selected power source pad, in which the power source terminals are proximate to each other in the IC chip.

Other objects and features of this invention will become apparent from the following description with reference to the accompanying drawings.

DETAILED DESCRIPTION

Embodiments of the IC chip according to the present invention will be described hereinafter with reference to the accompanying drawings. In the descriptions below, a first power source potential is designated as a power source potential VDD, and a second power source potential is designated as a ground potential GND. Although a description is omitted, it is to be understood that the present invention is applicable also to the case where a first power source potential is a ground potential GND and a second power source potential is a power source potential VDD.

Figure 1:
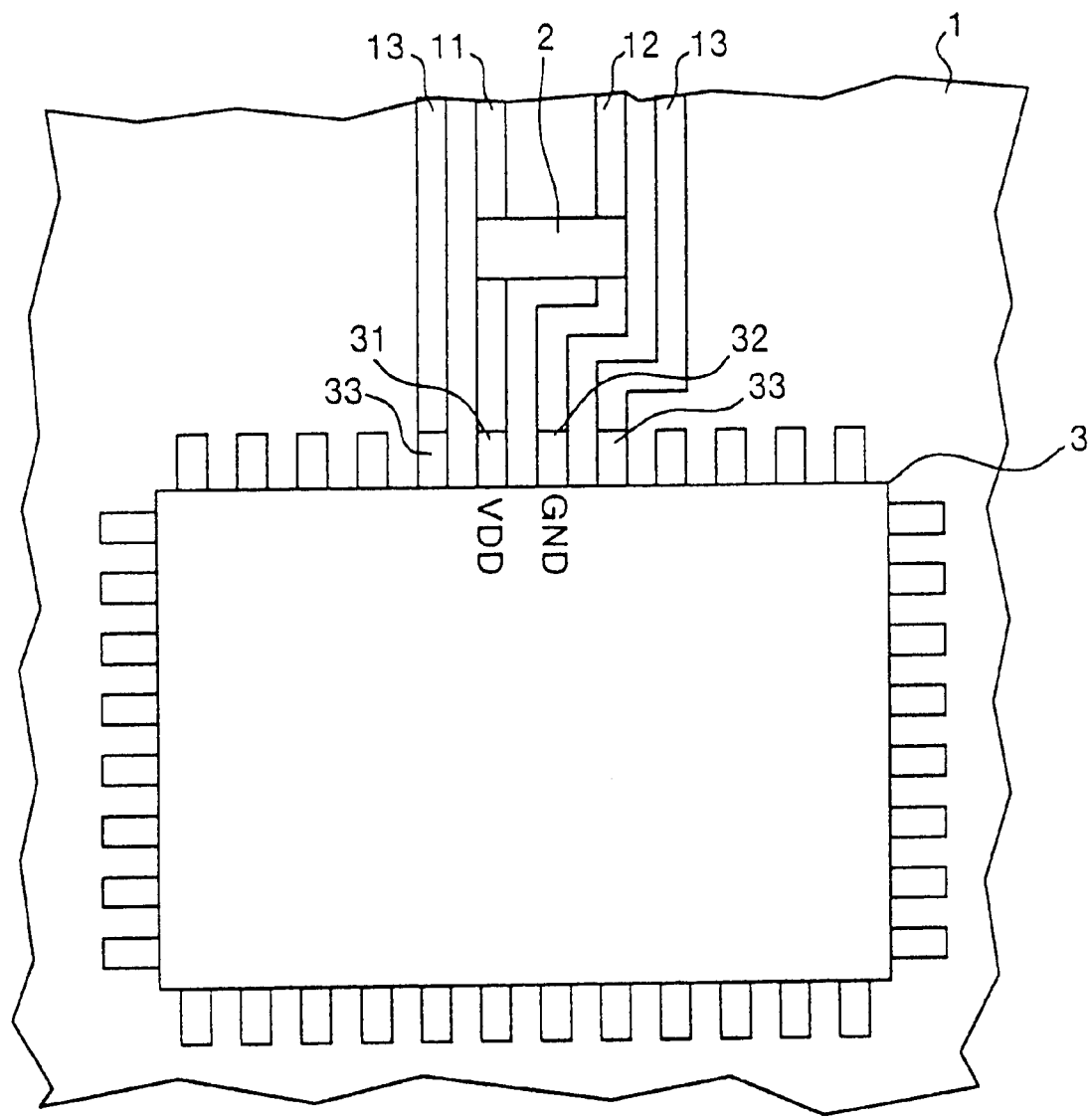
FIG. 1 is a diagram schematically showing the state in which a bypass capacitor is connected to a conventional IC chip by bending pattern wirings on a printed circuit board.
Figure 2:
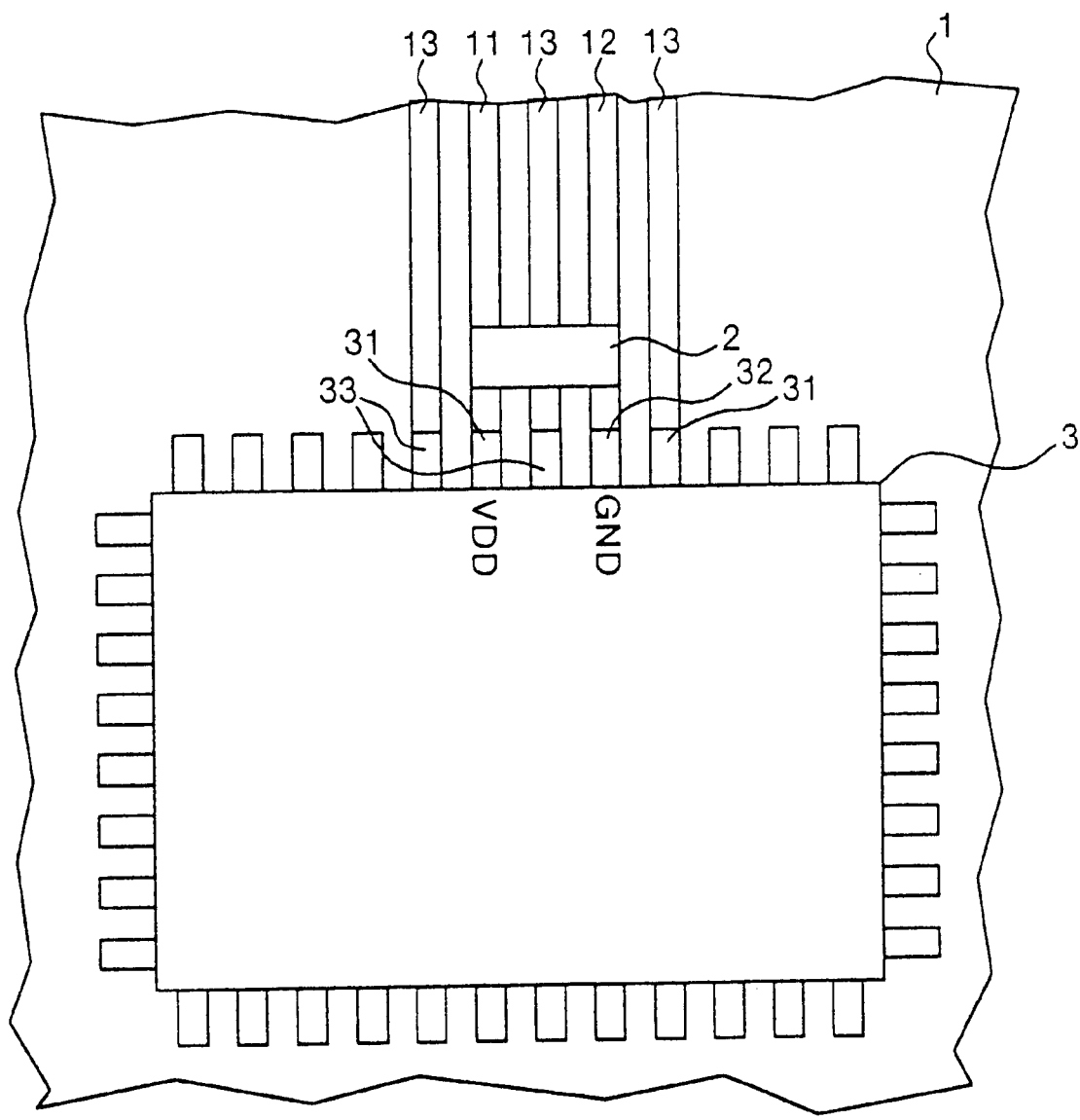
FIG. 2 is a diagram schematically showing the state in which a bypass capacitor is connected to a conventional IC chip by varying the arrangement of power source terminals.
Figure 3:
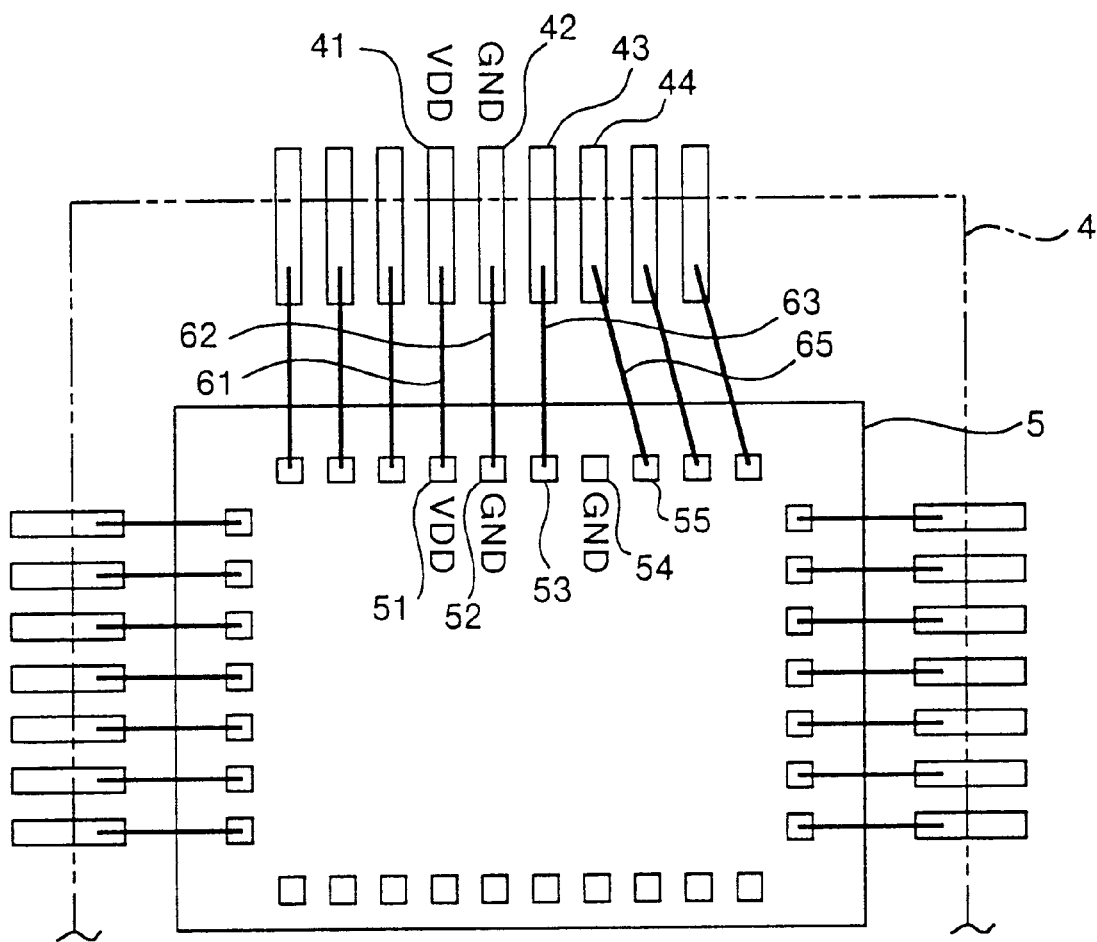
FIG. 3 is a diagram schematically showing an example of a bonding wiring structure in an IC chip according to a first preferred embodiment in the present invention.
Figure 4:
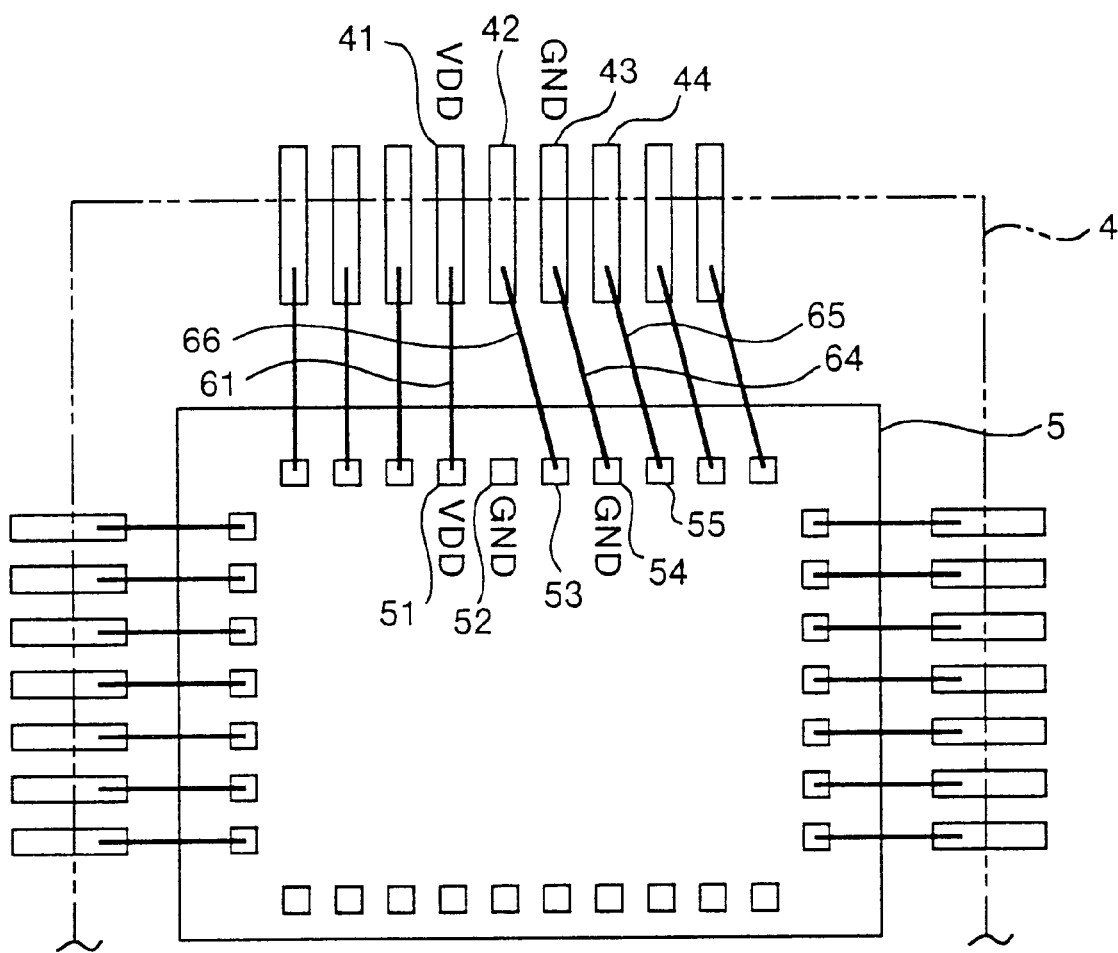
FIG. 4 is a diagram schematically showing another example of the bonding wiring structure in the IC chip according to the first preferred embodiment in the present invention.

FIG. 3 and FIG. 4 are diagrams schematically showing essential parts of an IC chip according to a first preferred embodiment in the present invention. FIG. 3 shows a normal bonding wiring structure. FIG. 4 shows a bonding wiring structure in which a power source terminal, to which a ground potential GND in the IC chip is applied, is replaced with a general signal terminal. On a semiconductor chip 5 for use in an IC chip 4 are arranged a first power source pad 51, to which a power source potential VDD is applied, a second power source pad 52, to which the ground potential GND is applied, a signal pad 53, and a third power source pad 54, to which the ground potential GND is applied, in this order. That is to say, the power source pads 52 and 54, to which the ground potential GND is applied, are arranged on the right and left of the single signal pad 53 in such a manner as to hold the signal pad 53 there between. The second power source pad 52 and the third power source pad 54 are electrically connected to each other inside of the semiconductor chip 5.

First, explanation will be given about the bonding wiring structure shown in FIG. 3. The first power source pad 51 is electrically connected to a first lead terminal 41, to which the power source potential VDD in the IC chip 4 is applied, via a bonding wire 61. The second power source pad 52 right adjacent to the first power source pad 51 in the illustration is electrically connected to a second lead terminal 42, to which the ground potential GND is applied, right adjacent to the first lead terminal 41 in the illustration via another bonding wire 62.

The first signal pad 53 right adjacent to the second power source pad 52 in the illustration is electrically connected to a third lead terminal 43 for a signal right adjacent to the second lead terminal 42 in the illustration via a further bonding wire 63. The third power source pad 54 right adjacent to the first signal pad 53 in the illustration is not connected to a lead terminal in the IC chip 4. A second signal pad 55 right adjacent to the third power source pad 54 in the illustration is electrically connected to a fourth lead terminal 44 for a signal right adjacent to the third lead terminal 43 in the illustration via a still further bonding wire 65.

Subsequently, explanation will be given about the bonding wiring structure shown in FIG. 4. The bonding wiring structure with respect to the first power source pad 51 and the second signal pad 55 is the same as that shown in FIG. 3. The second power source pad 52 is not connected to a lead terminal in the IC chip 4. The first signal pad 53 is electrically connected to the second lead terminal 42 via a bonding wire 66. The third power source pad 54 is electrically connected to the third lead terminal 43 via the bonding wire 64.

In the illustration in FIG. 4, the second lead terminal 42 is a terminal for a signal, and the third lead terminal 43 is a terminal for applying the ground potential GND. In other words, the wiring structure shown in FIG. 4 is different from the wiring structure shown in FIG. 3 in that the second lead terminal 42 is the terminal for the signal and the third lead terminal 43 is the terminal for applying the ground potential GND.

In the above-described first embodiment, the bonding wiring structure shown in FIG. 3 is suitable for the case where no external part such as a bypass capacitor is connected between the power source terminals in the IC chip 4, or the case where an external part having a size substantially equal to the pitch of the lead terminal in the IC chip 4 is connected; and further, the bonding wiring structure shown in FIG. 4, which can be obtained by changing the connected destination of the bonding wire, is suitable for the case where an external part having a size substantially double the pitch of the lead terminal in the IC chip 4 is connected. Thus, it becomes unnecessary to design two kinds of semiconductor chips different in position of the power source pad in accordance with the size of the external part, thereby shortening a period of time required for developing the semiconductor chip and reducing a development cost in comparison with the case where two kinds of semiconductor chips must be designed.

Figure 5:
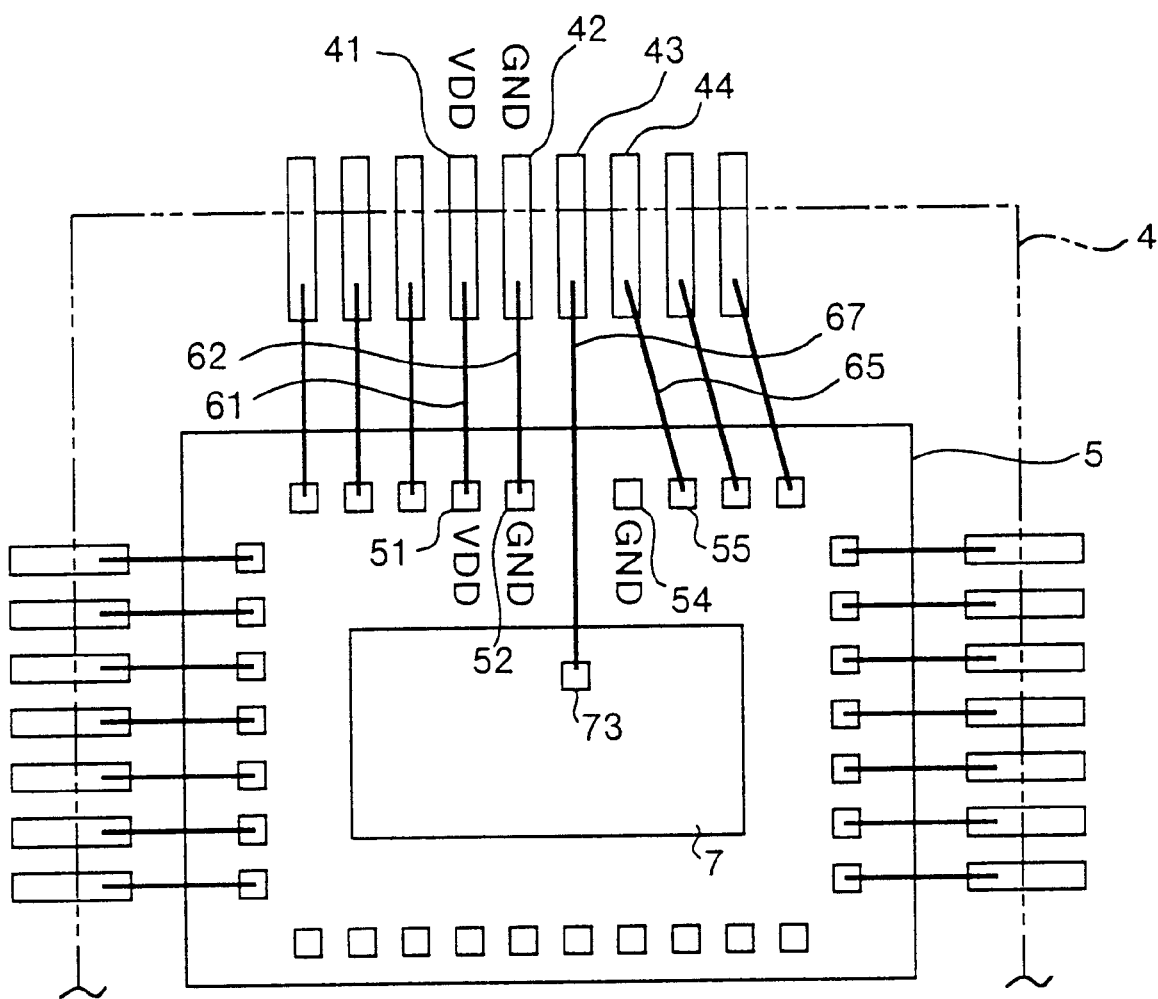
FIG. 5 is a diagram schematically showing an example of a bonding wiring structure in an IC chip according to a second preferred embodiment in the present invention.
Figure 6:
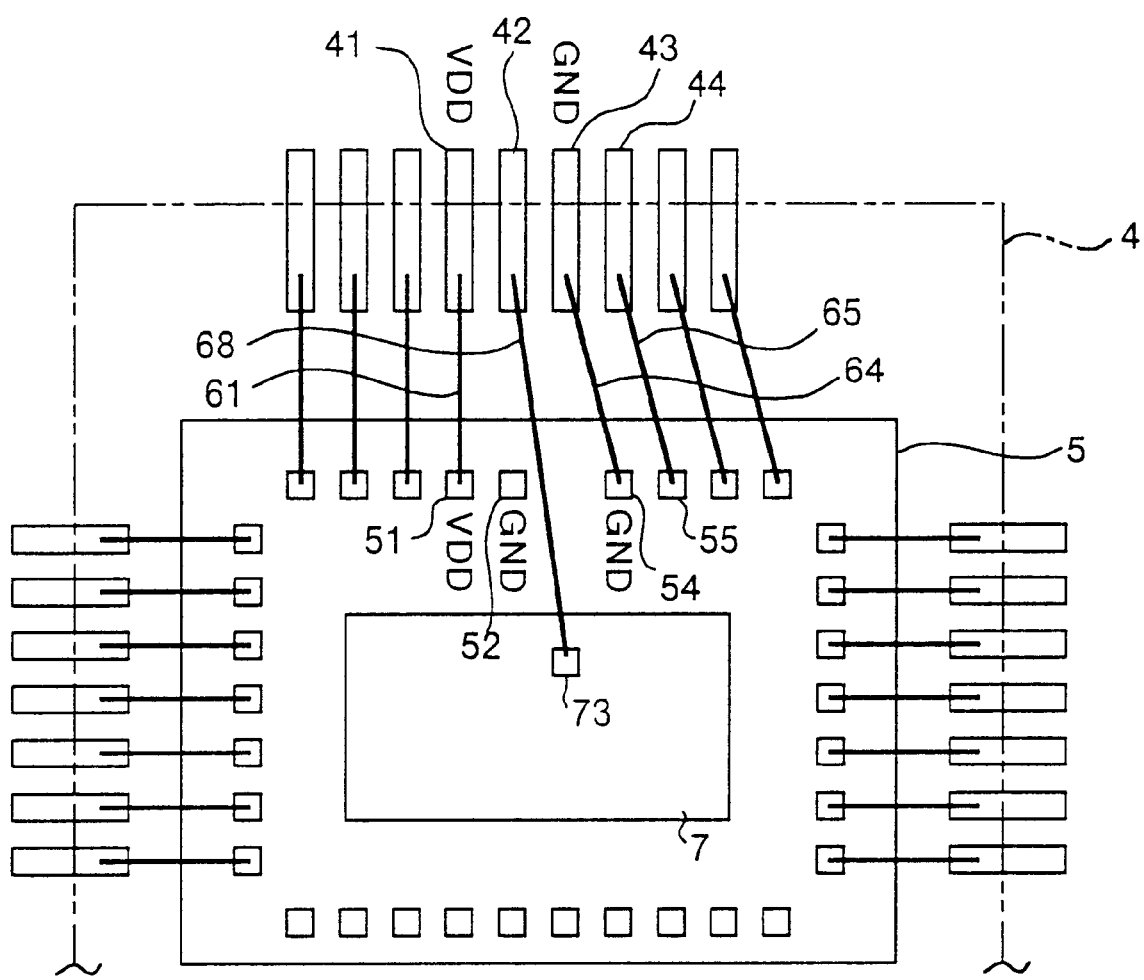
FIG. 6 is a diagram schematically showing another example of the bonding wiring structure in the IC chip according to the second preferred embodiment in the present invention.

FIG. 5 and FIG. 6 are diagrams schematically showing essential parts of an IC chip according to a second preferred embodiment in the present invention. FIG. 5 shows a normal bonding wiring structure. FIG. 6 shows a bonding wiring structure in which a power source terminal, to which a ground potential GND in the IC chip is applied, is replaced with a general signal terminal. The IC chip 4 in the first embodiment is configured in a multi-chip fashion such that a second semiconductor chip 7 is superimposed on a semiconductor chip 5 and a signal pad 73 corresponding to the first signal pad 53 is disposed on the second semiconductor chip 7 in the second embodiment. The same constituents as those in the first embodiment are designated by the same reference numerals, and therefore, the explanation will be omitted below.

In the bonding wiring structure shown in FIG. 5, the signal pad 73 on the second semiconductor chip 7 is electrically connected to a third lead terminal 43 via a bonding wire 67. In contrast, in the bonding wiring structure shown in FIG. 6, the signal pad 73 on the second semiconductor chip 7 is electrically connected to a second lead terminal 42 via a bonding wire 68. The other bonding wirings are the same as those in the first embodiment.

Strictly, the signal pad 73 is not positioned adjacent to a second power source pad 52, and a third power source pad 54 is not positioned adjacent to the signal pad 73. However, in the multi-chip configuration as shown, it is construed in the present specification that the signal pad 73 is positioned adjacent to the second power source pad 52 and the third power source pad 54 is positioned adjacent to the signal pad 73.

Like the above-described first embodiment, also in the multi-chip configuration in the second embodiment, in which the plurality of semiconductor chips are superimposed one on another, it becomes unnecessary to design the semiconductor chips different in position of the power source pad in accordance with the size of the external part, thereby shortening a period of time required for developing the semiconductor chip and reducing a development cost in comparison with the case where a plurality of kinds of semiconductor chips must be designed.

Figure 7:
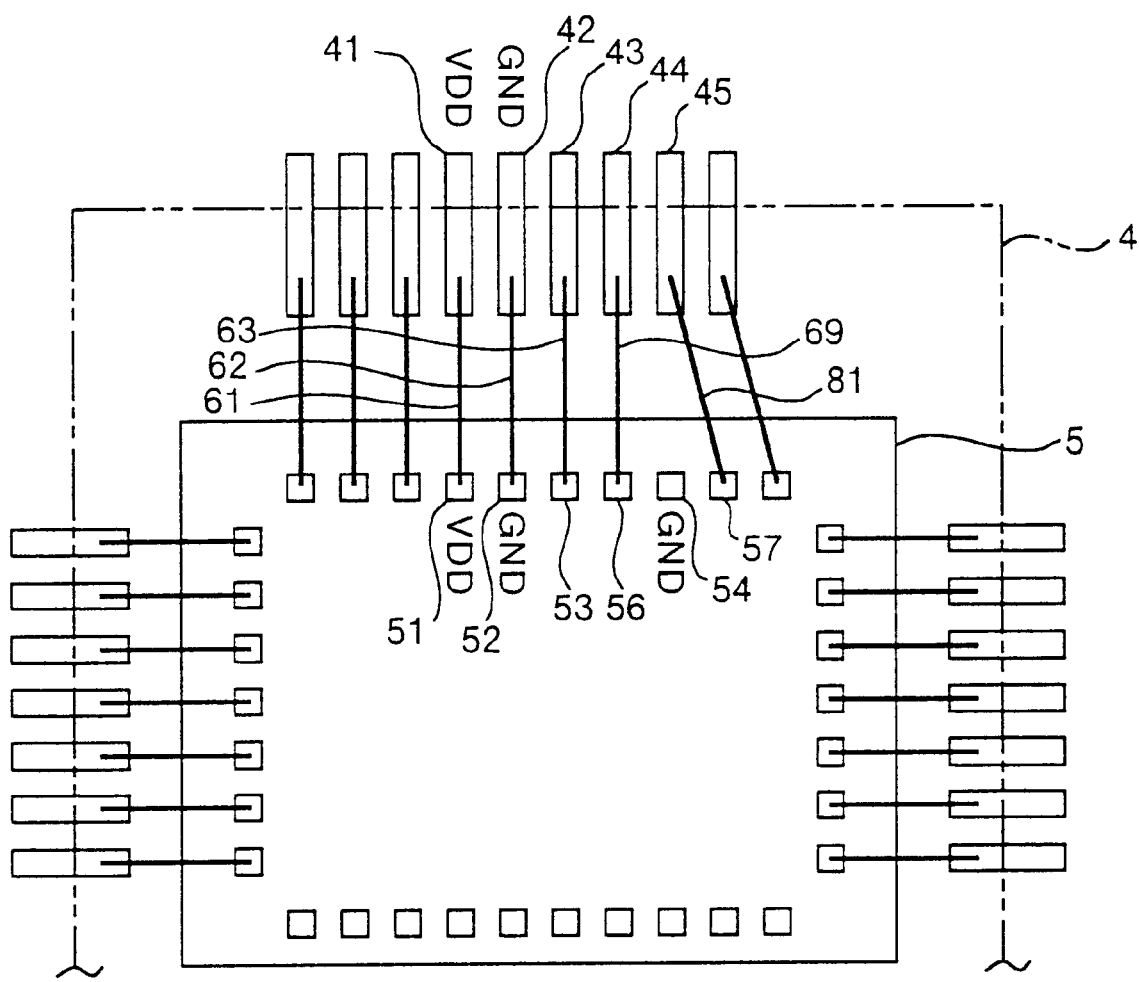
FIG. 7 is a diagram schematically showing an example of a bonding wiring structure in an IC chip according to a third preferred embodiment in the present invention.
Figure 8:
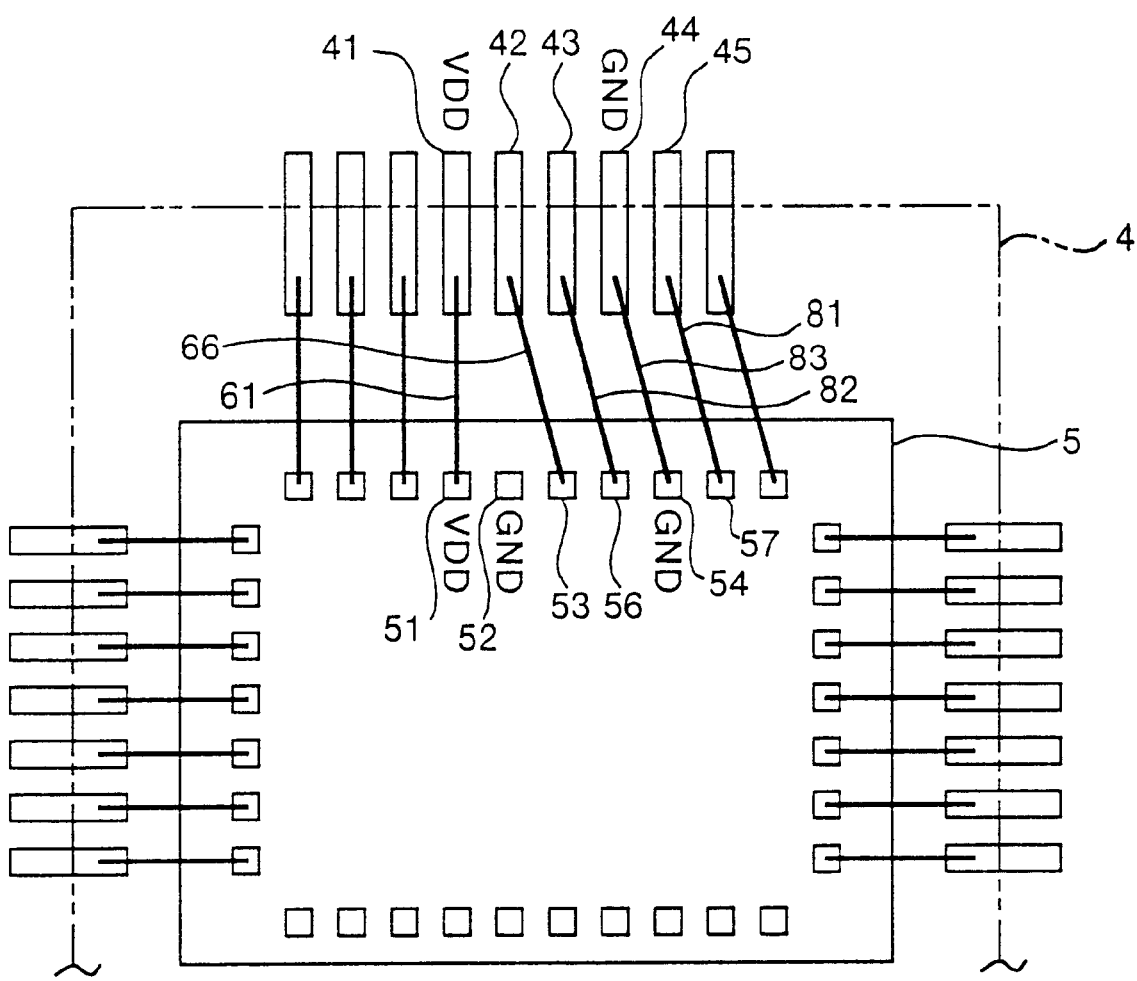
FIG. 8 is a diagram schematically showing another example of the bonding wiring structure in the IC chip according to the third preferred embodiment in the present invention.

FIG. 7 and FIG. 8 are diagrams schematically showing essential parts of an IC chip according to a third preferred embodiment in the present invention. FIG. 7 shows a normal bonding wiring structure. FIG. 8 shows a bonding wiring structure in which a power source terminal, to which a ground potential GND in the IC chip is applied, is replaced with a general signal terminal. On a semiconductor chip 5 for use in an IC chip 4 in the third embodiment are arranged a first power source pad 51, to which a power source potential VDD is applied, a second power source pad 52, to which the ground potential GND is applied, a first signal pad 53, a second signal pad 56, and a third power source pad 54, to which the ground potential GND is applied, in this order.

That is to say, the two signal pads 53 and 56 are interposed between the two power source pads 52 and 54, to which the ground potential GND is applied, in the third embodiment, unlike in the first embodiment. The same constituents as those in the first embodiment are designated by the same reference numerals, and therefore, the explanation will be omitted below.

In the bonding wiring structure shown in FIG. 7, the bonding wiring structure with respect to the first power source pad 51, the second power source pad 52, the first signal pad 53 and the third power source pad 54 is the same as that in the first embodiment shown in FIG. 3. The second signal pad 56 right adjacent to the first signal pad 53 in the illustration is electrically connected to a fourth lead terminal 44 for a signal right adjacent to a third lead terminal 43 in the illustration via a bonding wire 69. A third signal pad 57 right adjacent to the third power source pad 54 in the illustration is electrically connected to a fifth lead terminal 45 for a signal right adjacent to the fourth lead terminal 44 in the illustration via a bonding wire 81.

In the bonding wiring structure shown in FIG. 8, the bonding wiring structure with respect to the first power source pad 51, the second power source pad 52 and the first signal pad 53 is the same as that in the first embodiment shown in FIG. 4. The second signal pad 56 is electrically connected to a third lead terminal 43 via a bonding wire 82. The third power source pad 54 is electrically connected to the fourth lead terminal 44 via a bonding wire 83. The third signal pad 57 is electrically connected to the fifth lead terminal 45 via the bonding wire 81.

In the above-described third embodiment, the bonding wiring structure shown in FIG. 7 is suitable for the case where no external part such as a bypass capacitor is connected between the power source terminals in the IC chip 4, or the case where an external part having a size substantially equal to the pitch of the lead terminal in the IC chip 4 is connected; and further, the bonding wiring structure shown in FIG. 8, which can be obtained by changing the connected destination of the bonding wire, is suitable for the case where an external part having a size substantially triple the pitch of the lead terminal in the IC chip 4 is connected.

Thus, it becomes unnecessary to design two kinds of semiconductor chips different in position of the power source pad in accordance with the size of the external part, thereby shortening a period of time required for developing the semiconductor chip and reducing a development cost in comparison with the case where two kinds of semiconductor chips must be designed. The present third embodiment can produce a similar effect even if the multi-chip configuration is taken like in the second embodiment.

Figure 9:
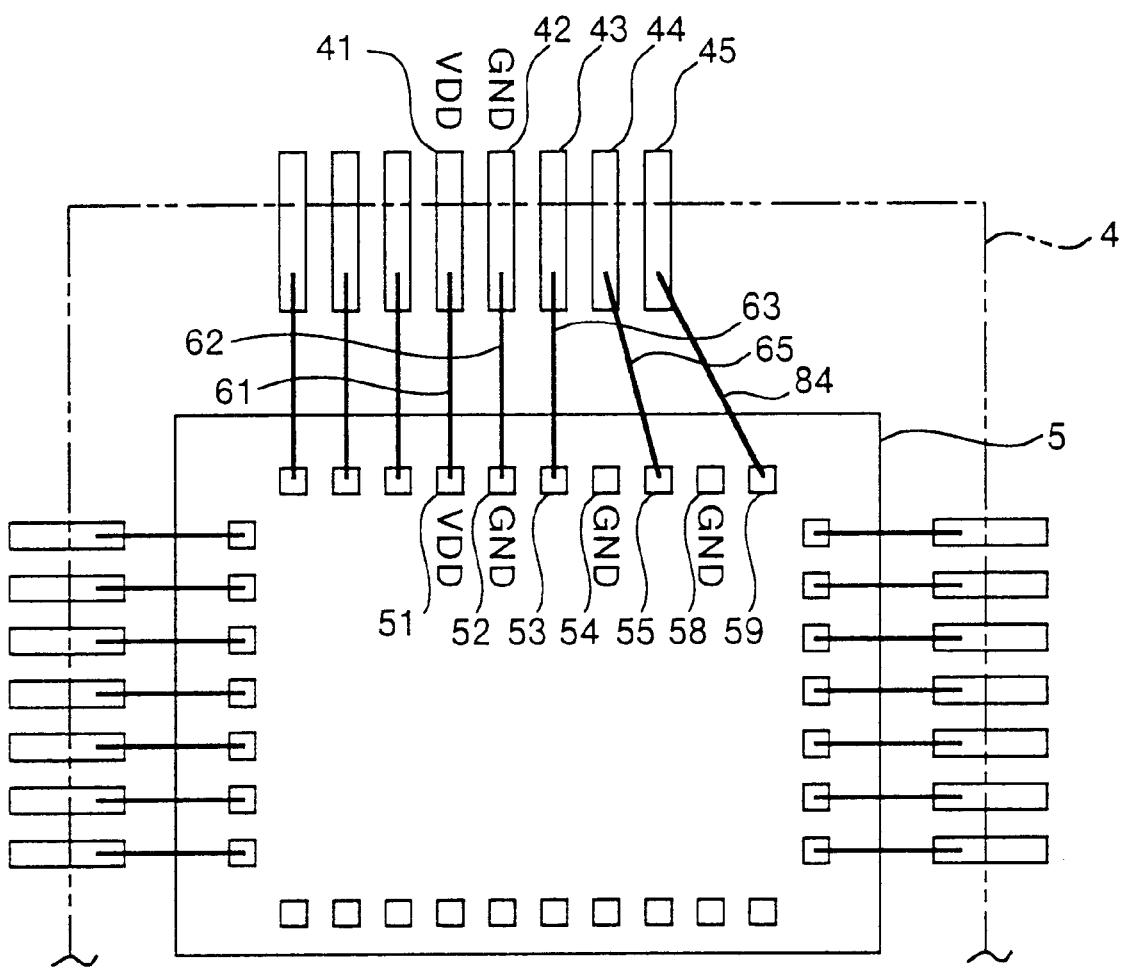
FIG. 9 is a diagram schematically showing an example of a bonding wiring structure in an IC chip according to a fourth preferred embodiment in the present invention.
Figure 10:
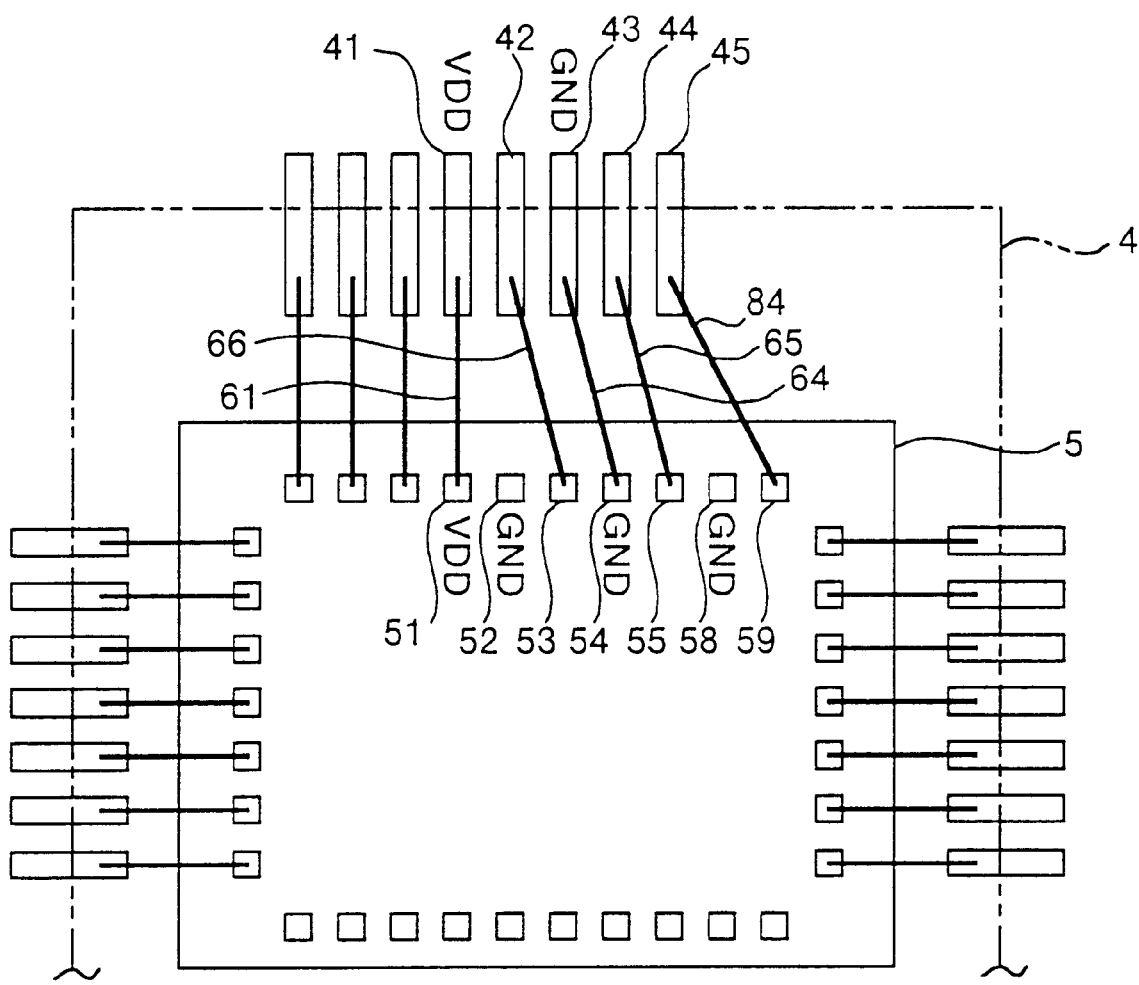
FIG. 10 is a diagram schematically showing another example of the bonding wiring structure in the IC chip according to the fourth preferred embodiment in the present invention.
Figure 11:
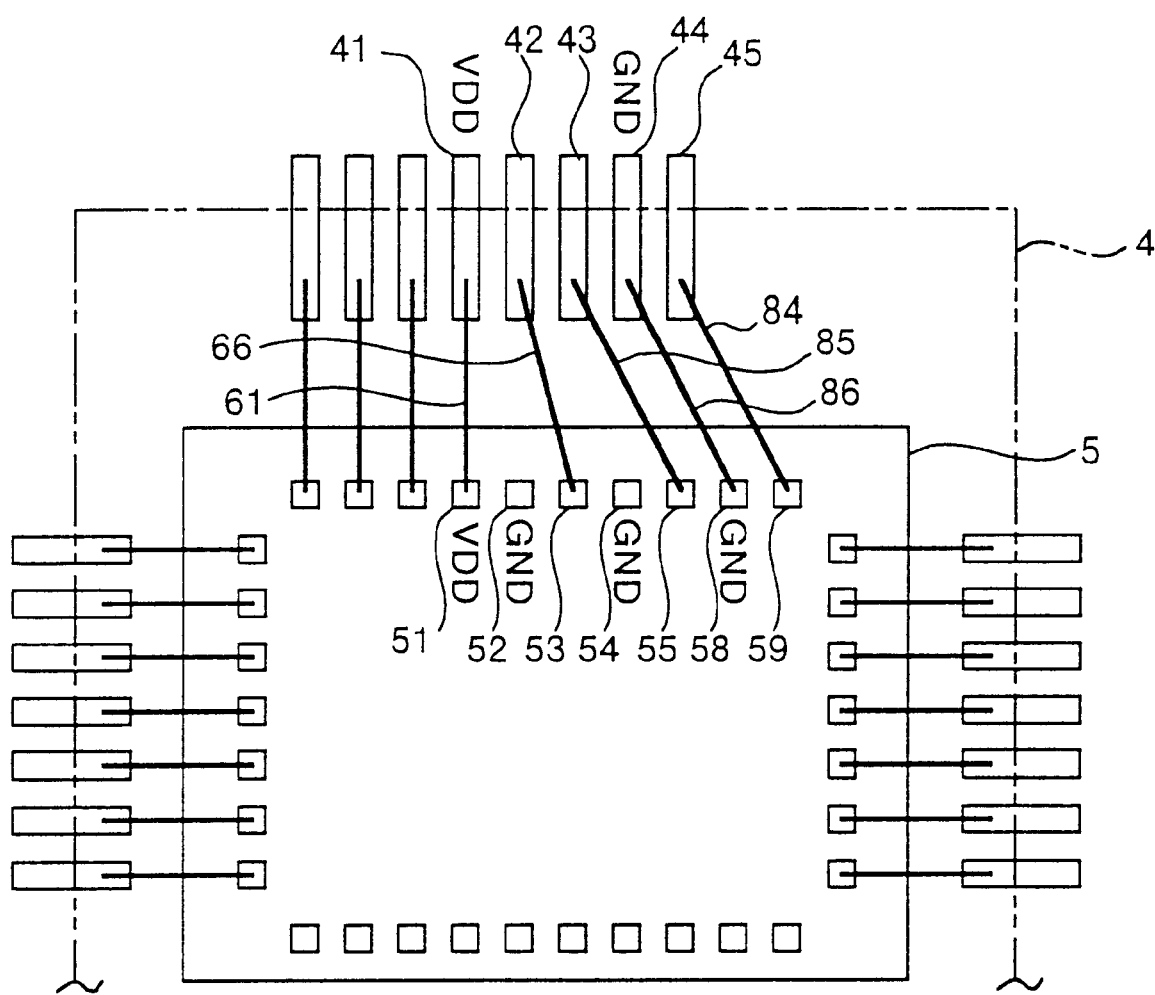
FIG. 11 is a diagram schematically showing a further example of the bonding wiring structure in the IC chip according to the fourth preferred embodiment in the present invention.

FIG. 9 to FIG. 11 are diagrams schematically showing essential parts of an IC chip according to a fourth preferred embodiment in the present invention. FIG. 9 shows a normal bonding wiring structure. FIG. 10 and FIG. 11 show different patterns of a bonding wiring structure in which a power source terminal, to which a ground potential GND in the IC chip is applied, is replaced with a general signal terminal. On a semiconductor chip 5 for use in an IC chip 4 in the fourth embodiment are arranged a first power source pad 51, to which a power source potential VDD is applied, a second power source pad 52, to which the ground potential GND is applied, a first signal pad 53, a third power source pad 54, to which the ground potential GND is applied, a second signal pad 55, and a fourth power source pad 58, to which the ground potential GND is applied, in this order. The same constituents as those in the first embodiment are designated by the same reference numerals, and therefore, the explanation will be omitted below.

In the bonding wiring structure shown in FIG. 9, the bonding wiring structure with respect to the first power source pad 51, the second power source pad 52, the first signal pad 53, the third power source pad 54 and the second signal pad 55 is the same as that in the first embodiment shown in FIG. 3. The fourth power source pad 58 right adjacent to the second signal pad 55 in the illustration is not connected to a lead terminal. A third signal pad 59 right adjacent to the fourth power source pad 58 in the illustration is electrically connected to a fifth lead terminal 45 for a signal right adjacent to a fourth lead terminal 44 in the illustration via a bonding wire 84. In the illustration of FIG. 9, an interval between the power source terminals (i.e., a first lead terminal 41 and a second lead terminal 42) in the IC chip 4 is equal to the pitch of the lead terminal in the IC chip 4.

In the bonding wiring structure shown in FIG. 10, the bonding wiring structure with respect to the first power source pad 51, the second power source pad 52, the first signal pad 53, the third power source pad 54 and the second signal pad 55 is the same as that in the first embodiment shown in FIG. 4. The fourth power source pad 58 is not connected to a lead terminal. The third signal pad 59 is electrically connected to the fifth lead terminal 45 for a signal via the bonding wire 84. In the illustration of FIG. 10, an interval between the power source terminals (i.e., the first lead terminal 41 and a third lead terminal 43) in the IC chip 4 is equal to double the pitch of the lead terminal in the IC chip 4.

In the bonding wiring structure shown in FIG. 11, the bonding wiring structure with respect to the first power source pad 51, the second power source pad 52 and the first signal pad 53 is the same as that in the first embodiment shown in FIG. 4. The third power source pad 54 is not connected to a lead terminal. The second signal pad 55 is electrically connected to the third lead terminal 43 for a signal via a bonding wire 85. The fourth power source pad 58 is electrically connected to the fourth lead terminal 44 via a bonding wire 86. The third signal pad 59 is electrically connected to the fifth lead terminal 45 for a signal via the bonding wire 84. In the illustration of FIG. 11, an interval between the power source terminals (i.e., the first lead terminal 41 and the fourth lead terminal 44) in the IC chip 4 is equal to triple the pitch of the lead terminal in the IC chip 4.

In the above-described fourth embodiment, the bonding wiring structure shown in FIG. 9 is suitable for the case where no external part such as a bypass capacitor is connected between the power source terminals in the IC chip 4, or the case where an external part having a size substantially equal to the pitch of the lead terminal in the IC chip 4 is connected; the bonding wiring structure shown in FIG. 10 is suitable for the case where an external part having a size substantially double the pitch of the lead terminal in the IC chip 4 is connected; and further, the bonding wiring structure shown in FIG. 11 is suitable for the case where an external part having a size substantially triple the pitch of the lead terminal in the IC chip 4 is connected.

Thus, it becomes unnecessary to design three kinds of semiconductor chips different in position of the power source pad in accordance with the size of the external part, thereby shortening a period of time required for developing the semiconductor chip and reducing a development cost in comparison with the case where three kinds of semiconductor chips must be designed. The present fourth embodiment can produce a similar effect even if the multi-chip configuration is taken like in the second embodiment.

The present invention is not limited to the above-described embodiments, and can be modified in various manners. For example, in the fourth embodiment, a power source pad, to which the ground potential GND is applied, may be further arranged right adjacent to the third signal pad 59; and further, one or more signal pads and power source pads, to which the ground potential GND is applied, may be alternately arranged right adjacent to the power source pad adjacent to the third signal pad 59. In addition, the number of signal pads interposed between the power source pads, to which the ground potential GND is applied, may range from 3 to 13.

According to the present invention, the interval between the power source terminal, to which the first power source potential is applied, and the power source terminal, to which the second power source potential is applied, proximate to each other in the IC chip, is varied by an integral multiple of the interval between the lead terminals in the IC chip according to the power source pad selected as the power source pad, to which the second power source potential is applied, in the semiconductor chip. Consequently, the interval between the power source wiring, to which the first power source potential is applied, and the power source wiring, to which the second power source potential is applied, in the printed circuit board mounting the IC chip thereon can be made equal to the size of the external part connected between the power source wirings.

Thus, it is possible to provide the IC chip in which the power source terminals are arranged in different patterns by simply changing the connection of the bonding wirings in the semiconductor chip fabricated based on one and the same design, thereby shortening a period of time required for developing the semiconductor chip and reducing a development cost in comparison with the case where various kinds of semiconductor chips different in position of the power source pad must be designed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An IC chip comprising:
   a first power source pad, wherein a first power source potential is applied to the first power source pad;
   a second power source pad arranged adjacent to the first power source pad, wherein a second power source potential is applied to the second power source pad;
   a signal pad arranged adjacent to the second power source pad, wherein a signal potential other than the first power source potential and the second power source potential is applied to the signal pad;
   a third power source pad arranged adjacent to the signal pad, wherein the second power source potential is applied to the third power source pad; and
   a lead terminal to which only the second power source pad or the third power source pad is connected, wherein the second power source potential is applied the lead terminal.

2. The IC chip according to claim 1, wherein one or more and twelve or less of signal pads are further interposed between the signal pad and the third power source pad.

3. The IC chip according to claim 1, wherein one or two or more of the signal pads interposed between the second power source pad and the third power source pad, and either one or both of the second power source pad and the third power source pad are arranged on separate semiconductor chips superimposed one on another.

4. An IC chip comprising:
   a first power source pad, wherein a first power source potential is applied to the first power source pad;
   a second power source pad arranged adjacent to the first power source pad, wherein a second power source potential is applied to the second power source pad;
   a first signal pad arranged adjacent to the second power source pad, wherein a signal potential other than the first power source potential and the second power source potential is applied to the first signal pad;
   a third power source pad arranged adjacent to the first signal pad, wherein the second power source potential is applied to the third power source pad;
   a second signal pad arranged adjacent to the third power source pad, wherein a signal potential other than the first power source potential and the second power source potential is applied to the second signal pad;

a fourth power source pad arranged adjacent to the second signal pad, wherein the second power source potential is applied to the fourth power source pad; and a lead terminal to which only the second power source pad or the third power source pad or the fourth power source pad is connected, wherein the second power source potential is applied to the lead terminal.

5. The IC chip according to claim 4, wherein one or more and twelve or less of signal pads are further interposed between the first signal pad and the third power source pad or between the second signal pad and the fourth power source pad.

6. The IC chip according to claim 4, wherein at least one of the signal pad interposed between the second power source pad and the third power source pad and the signal pad interposed between the third power source pad and the fourth power source pad, and at least one of the second power source pad, the third power source pad and the fourth power source pad are arranged on separate semiconductor chips superimposed one on another.

* * * * *